(12) United States Patent
Tsuruoka et al.

(10) Patent No.: US 8,951,816 B2
(45) Date of Patent: Feb. 10, 2015

(54) FILM FORMING METHOD (75) Inventors: Rena Tsuruoka, Hyogo (JP); Hisao Ikeda, Kanagawa-ken (JP); Takuya Tsurume, Kanagawa-ken (JP); Tohru Sonoda, Osaka (JP); Satoshi Inoue, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 317 days.

(21) Appl. No.: 13/635,201

(22) PCT Filed: Feb. 28, 2011

(86) PCT No.: PCT/JP2011/054532
§ 371 (c)(1),
(2), (4) Date: Sep. 14, 2012

(87) PCT Pub. No.: WO2011/114874
PCT Pub. Date: Sep. 22, 2011

(65) Prior Publication Data
US 2013/0011943 A1    Jan. 10, 2013

(30) Foreign Application Priority Data
Mar. 18, 2010   (JP) ................................. 2010-062711

(51) Int. Cl.
*H01L 21/00* (2006.01)
*H01L 51/00* (2006.01)
(Continued)

(52) U.S. Cl.
CPC ............ *H01L 51/0013* (2013.01); *C23C 14/04* (2013.01); *H01L 51/56* (2013.01)
USPC ................................ 438/22; 438/29; 438/795

(58) Field of Classification Search
CPC . H01L 51/5012; H01L 51/0013; H01L 51/56; C23C 14/04; C23C 14/0021

USPC ........ 438/22, 29, 679, 795; 257/40, E51.018, 257/E51.022
See application file for complete search history.

(56) References Cited

U.S. PATENT DOCUMENTS

| 5,904,961 A | 5/1999 | Tang et al. |
| 6,610,455 B1 | 8/2003 | Burberry et al. |

(Continued)

FOREIGN PATENT DOCUMENTS

| CN | 1369573 A | 9/2002 |
| CN | 1436025 A | 8/2003 |

(Continued)

OTHER PUBLICATIONS

International Search Report re application No. PCT/JP2011/054532, dated Mar. 29, 2011.

*Primary Examiner* — Khiem D Nguyen
(74) *Attorney, Agent, or Firm* — Husch Blackwell LLP (57) ABSTRACT

One embodiment of the present invention is a film forming method comprising: arranging a surface of a film formation substrate 10 including an absorption layer 12 on a first substrate 11 and a material layer 13 containing a film formation material and a surface of a film-formation target substrate 20 including a first layer 23 over a second substrate 22, so as to face each other; forming a second layer 13a containing the film formation material over the first layer 23 by performing first heat treatment on the material layer 13; and forming a third layer 13b containing the film formation material over the second layer 13a by performing second heat treatment on the material layer 13. In the second heat treatment, energy with a density higher than that in the first heat treatment is applied to the material layer.

17 Claims, 5 Drawing Sheets

(51) Int. Cl.
 *C23C 14/04* (2006.01)
 *H01L 51/56* (2006.01)

(56) References Cited

U.S. PATENT DOCUMENTS

| | | | |
|---|---|---|---|
| 7,691,783 | B2 | 4/2010 | Matsuda et al. |
| 7,767,489 | B2 | 8/2010 | Kwon et al. |
| 8,119,204 | B2 | 2/2012 | Ikeda et al. |
| 2002/0139303 | A1 | 10/2002 | Yamazaki et al. |
| 2004/0001972 | A1 | 1/2004 | Chin et al. |
| 2005/0095459 | A1 | 5/2005 | Chin et al. |
| 2005/0142380 | A1 | 6/2005 | Chin et al. |
| 2006/0061267 | A1 | 3/2006 | Yamasaki et al. |
| 2006/0246240 | A1 | 11/2006 | Matsuda et al. |
| 2007/0082288 | A1 | 4/2007 | Wright et al. |
| 2007/0257276 | A1 | 11/2007 | Kwon et al. |
| 2007/0290611 | A1 | 12/2007 | Yamasaki et al. |
| 2008/0233827 | A1 | 9/2008 | Kagami et al. |
| 2008/0241733 | A1 | 10/2008 | Wright et al. |
| 2008/0268135 | A1 | 10/2008 | Yokoyama et al. |
| 2008/0268137 | A1 | 10/2008 | Ikeda et al. |
| 2009/0058285 | A1 | 3/2009 | Yamazaki et al. |
| 2009/0104403 | A1* | 4/2009 | Aoyama et al. ............... 428/136 |
| 2009/0166563 | A1* | 7/2009 | Yokoyama et al. ......... 250/492.1 |
| 2009/0305445 | A1* | 12/2009 | Ikeda et al. ..................... 438/29 |
| 2012/0148730 | A1 | 6/2012 | Ikeda et al. |

FOREIGN PATENT DOCUMENTS

| | | |
|---|---|---|
| CN | 1469692 A | 1/2004 |
| CN | 101040396 A | 9/2007 |
| CN | 101068042 A | 11/2007 |
| CN | 101272643 A | 9/2008 |
| CN | 101283627 A | 10/2008 |
| CN | 101397649 A | 4/2009 |
| EP | 1 335 637 A1 | 8/2003 |
| EP | 1 852 921 A2 | 11/2007 |
| JP | 10-245547 | 9/1998 |
| JP | 2002-302757 | 10/2002 |
| JP | 2003-229259 | 8/2003 |
| JP | 2004-39630 | 2/2004 |
| JP | 2006-86069 | 3/2006 |
| JP | 2006-309995 | 11/2006 |
| JP | 2007-299736 | 11/2007 |
| JP | 2008-235010 | 10/2008 |
| JP | 2008-288017 | 11/2008 |
| JP | 2008-291352 | 12/2008 |
| JP | 2009-69849 | 4/2009 |
| JP | 2010-7101 | 1/2010 |
| KR | 2002-0064215 | 8/2002 |
| KR | 10-2004-0001381 | 1/2004 |
| KR | 10-2007-0029768 | 3/2007 |
| KR | 10-0731755 B1 | 6/2007 |
| KR | 10-2007-0072521 | 7/2007 |
| KR | 10-2008-0063294 | 7/2008 |
| KR | 10-2008-0085705 | 9/2008 |
| KR | 10-2008-0096381 | 10/2008 |
| KR | 10-2010-00020078 | 1/2010 |
| WO | WO 2006/036297 A2 | 4/2006 |
| WO | WO 2007/044518 A1 | 4/2007 |

* cited by examiner

FILM FORMING METHOD

TECHNICAL FIELD

The present invention relates to a film forming method by which a film is formed over a substrate.

BACKGROUND ART

In recent years, research has been extensively conducted on light-emitting elements using electroluminescence (Electro Luminescence, hereinafter also referred to as EL). In a basic structure of such a light-emitting element, a light-emitting layer containing a substance with a light-emitting property is interposed between a pair of electrodes. By applying a voltage to this element, light emission can be obtained from the substance with a light-emitting property.

An EL layer included in a light-emitting element includes at least a light-emitting layer. In addition, the EL layer can have a stacked-layer structure including a hole-inject layer, a hole-transport layer, an electron-transport layer, an electron-inject layer, and the like, in addition to the light-emitting layer.

A conventional film forming method will be described below.

A transfer substrate in which a light-absorption layer is formed over one surface of a support substrate and a transfer layer is formed over the light-absorption layer is prepared. Further, a transfer target substrate in which a bottom electrode is formed over a substrate, a hole-inject layer is formed over the bottom electrode, and a hole-transport layer is formed over the hole-inject layer is prepared.

Then, the transfer layer of the transfer substrate and the hole-transport layer of the transfer target substrate are arranged so as to face each other; a laser beam is emitted from the other surface of the support substrate; the laser beam is absorbed into the light-absorption layer; and by using the heat, the transfer layer is transferred onto the hole-transport layer of the transfer target substrate; thus, a light-emitting layer is formed over the hole-transport layer (for example, see Patent Document 1).

PRIOR ART DOCUMENT

Patent Document

Patent Document 1: Japanese Published Patent Application No. 2006-309995

SUMMARY OF INVENTION

Problems to be Solved by the Invention

The conventional film forming method described above has a problem in that, when the energy density of light to be absorbed into the light-absorption layer is increased, a base layer of the transfer layer is damaged, though a good transfer layer can be transferred onto the transfer target substrate. In contrast, when the energy density of light to be absorbed into the light-absorption layer is decreased, it has a problem in that a good transfer layer cannot be transferred, though damage to the base layer of the transfer layer transferred onto the transfer target substrate can be suppressed.

It is an object of one embodiment of the present invention to provide a film forming method by which a good transfer layer can be transferred onto a film-formation target substrate, while suppressing damage to a base layer of the transfer layer.

Means for Solving the Problems

One embodiment of the present invention is a film forming method including:
arranging one surface of a first substrate including an absorption layer that is formed on the one surface of the first substrate and a material layer that is formed on the absorption layer and contains a film formation material and
a film-formation target surface of a second substrate that is provided with a first layer over the film-formation target surface, so as to face each other;
forming a second layer that contains the film formation material over the first layer of the second substrate by performing first heat treatment on the material layer from the other surface of the first substrate; and
forming a third layer that contains the film formation material over the second layer of the second substrate by performing second heat treatment on the material layer from the other surface of the first substrate,
characterized in that energy with a density higher than that in the first heat treatment is applied to the material layer in the second heat treatment.

According to one embodiment of the present invention, the second layer is formed over the first layer of the second substrate by the first heat treatment, and the third layer is formed over the second layer by the second heat treatment performed with an energy density higher than that of the first heat treatment. The second layer and the first layer are separated by a boundary; therefore, the third layer can have good quality, and damage to the first layer that is a base layer of the second layer can be suppressed.

Further, in the film formation method according to one embodiment of the present invention,
the material layer can include two or more kinds of film formation materials and a high molecular compound satisfying a formula (1) below.

$$Ta-100 \leq S \leq 400 \qquad (1)$$

Note that in the formula (1), S represents a glass transition temperature (° C.) of the high molecular compound, and Ta represents a temperature (° C.) which is the higher of sublimation temperatures of the two or more kinds of film formation materials.

With the use of a high molecular material, a film having more uniform concentration distribution can be formed.

One embodiment of the present invention is a film forming method including:
arranging one surface of a first substrate including a first absorption layer that is formed on the one surface of the first substrate and a first material layer that is formed on the first absorption layer and contains a film formation material and
a film-formation target surface of a second substrate provided with a first layer over the film-formation target surface, so as to face each other;
forming a second layer that contains the film formation material over the first layer of the second substrate by performing first heat treatment on the first material layer from the other surface of the first substrate;
arranging one surface of a third substrate including a second absorption layer that is formed on one surface of the third substrate and a second material layer that is formed on the second absorption layer and contains the film formation material and the film-formation target surface of the second substrate, so as to face each other; and forming a third layer that contains the film formation material over the second layer of the second substrate by performing second heat treatment on the second material layer from the other surface of the third substrate, characterized in that energy with a density higher than that in the first heat treatment is applied to the second material layer in the second heat treatment.

Further, in the film formation method according to one embodiment of the present invention, each of the first material layer and the second material layer can include two or more kinds of film formation materials and a high molecular compound satisfying a formula (1) below.

$$Ta-100 \leq S \leq 400 \tag{1}$$

Note that in the formula (1), S represents a glass transition temperature (° C.) of the high molecular compound, and Ta represents a temperature (° C.) which is the higher of sublimation temperatures of the two or more kinds of film formation materials.

With the use of a high molecular material, a film having more uniform concentration distribution can be formed.

Further, in the film formation method according to one embodiment of the present invention, it is also possible for the third layer and the second layer to be mixed and for the third layer and the first layer not to be mixed.

Further, in the film formation method according to one embodiment of the present invention, a density of energy applied to the material layer in the second heat treatment is preferably energy density at which the film formation material contained in the third layer reaches the second layer but does not reach the first layer.

Further, in the film formation method according to one embodiment of the present invention, a density of energy applied to the material layer in the first heat treatment is preferably energy density at which the film formation material contained in the second layer does not reach the first layer.

Further, in the film formation method according to one embodiment of the present invention, the first heat treatment and the second heat treatment are each preferably performed using a method of applying heat by light irradiation from the other surface of the first substrate with a light source and by absorption of the light in the absorption layer.

Further, in the film formation method according to one embodiment of the present invention, the first heat treatment is preferably performed using a method of applying heat by light irradiation from the other surface of the first substrate with a halogen lamp and by absorption of the light in the first absorption layer, and the second heat treatment is preferably performed by a method of applying heat by light irradiation from the other surface of the third substrate with a flash lamp and by absorption of the light in the second absorption layer.

Further, in the film formation method according to one embodiment of the present invention, the first layer is preferably a hole-transport layer, and the second layer and the third layer are preferably layers that contain a light-emitting substance.

Effect of the Invention

By application of one embodiment of the present invention, it is possible to provide a film forming method by which a good transfer layer can be transferred onto a film-formation target substrate, while suppressing damage to a base layer of the transfer layer.

MODE FOR CARRYING OUT THE INVENTION

Hereinafter, embodiments of the present invention will be described in detail with reference to drawings. However, the present invention is not limited to the following description and it is easily understood by those skilled in the art that the modes and details can be variously changed without departing from the spirit and scope of the present invention. Therefore, the present invention should not be construed as being limited to the description in the following embodiments.

Embodiment 1

Figure 1A:
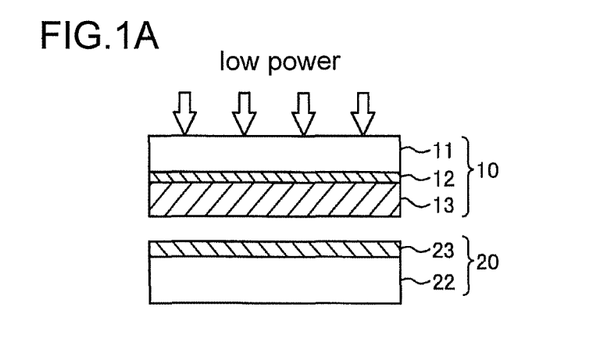
FIGS. 1A to 1C are cross-sectional views for illustrating a film forming method of one embodiment of the present invention.
Figure 1B:
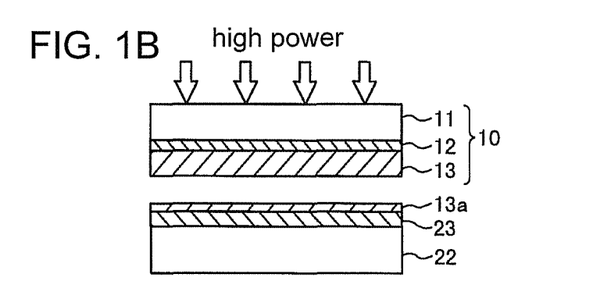
Figure 1C:
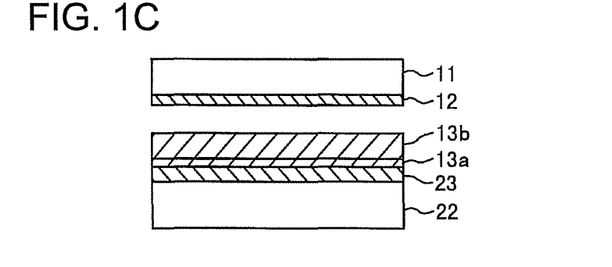

In this embodiment, a film forming method of one embodiment of the present invention will be described. Note that in this embodiment, the case where an EL layer of a light-emitting element is formed by a film forming method of one embodiment of the present invention will be described. Further, in this embodiment, the case where heat treatment is performed with a light source will be described. FIGS. 1A to 1C are cross-sectional views for illustrating a film forming method of one embodiment of the present invention.

First, as shown in FIG. 1A, a film formation substrate (donor substrate) 10 in which an absorption layer 12 is formed on one surface of a first substrate 11 that is a support substrate and an organic EL material layer (hereinafter referred to as "material layer") 13 containing at least a film formation material is formed on the absorption layer 12 is prepared. Note that FIG. 1A illustrates the case where the material layer 13 contains only a film formation material. Further, a film-formation target substrate 20 in which a desired layer, e.g. a hole-transport layer 23 is formed by a film formation treatment over a second substrate 22 is prepared. Then, the second substrate 22 that is the film-formation target substrate 20 is arranged in the position facing the surface of the first substrate 11 on which the absorption layer 12 and the material layer 13 are formed. Note that it is preferable that the film formation material contained in the material layer 13 be not contained in the hole-transport layer 23.

Then, light irradiation is performed with a flash lamp from a rear surface of the first substrate 11, i.e. a surface on the side opposite to the surface on which the material layer 13 is formed, as indicated by arrows. For an irradiation condition in that case, a low power condition where the energy density is low (for example, a charge voltage of 650 V) is used. The irradiation light is transmitted through the first substrate 11 and absorbed into the absorption layer 12. The absorbed light is converted to heat energy, whereby the region of the material layer 13, which overlaps with the absorption layer 12 is heated (first heat treatment). The heated material layer 13 is transferred onto the hole-transport layer 23. That is, as shown in FIG. 1B, a first EL layer 13a containing the film formation material is formed over the hole-transport layer 23, and the material layer 13 containing the film formation material is left on the film formation substrate 10.

The light irradiation is performed under the low power condition where the energy density is low as described above; therefore, damage to the hole-transport layer 23 that is a base layer of the first EL layer 13a can be suppressed, and the first EL layer 13a and the hole-transport layer 23 are separated by a boundary without being mixed with each other. That is, the low power condition where the energy density is low is such that an energy density at which the film formation material contained in the first EL layer 13a does not reach the hole-transport layer 23 is used. Accordingly, damage to the hole-transport layer 23 can be suppressed, and the first EL layer 13a and the hole-transport layer 23 are separated by the boundary.

Note that the separation of the first EL layer 13a and the hole-transport layer 23 by the boundary may be observed by TEM (Transmission Electron Microscope) or ToF-SIMS (Time of Flight-Secondary Ion Mass Spectrometry) of oblique cutting.

Then, as shown in FIG. 1B, light irradiation is performed with a flash lamp from the rear surface of the first substrate 11 as indicated by arrows. For an irradiation condition in that case, a high power condition where the energy density is high (for example, a charge voltage of 800 V) is used. The irradiation light is transmitted through the first substrate 11 and absorbed into the absorption layer 12. The absorbed light is converted to heat energy, whereby the region of the material layer 13, which overlaps with the absorption layer 12 is heated (second heat treatment). The heated material layer 13 is transferred onto the first EL layer 13a. That is, as shown in FIG. 1C, a second EL layer 13b containing the film formation material is formed over the first EL layer 13a. Note that the film formation material is not left on the film formation substrate 10. In the case where a material other than the film formation material (for example, a high molecular compound to be described later or the like) is contained in the material layer 13, a material layer containing the material other than the film formation material is left on the film formation substrate 10 in FIG. 1C.

Since the light irradiation is performed under the high power condition where the energy density is high as described above, the second EL layer 13b can have good quality. Specifically, a residue is not likely to be left and a uniform layer and film can be formed over an entire surface; a thick layer having a cross-sectional profile that is not much varied can be formed; and it is possible to shorten a cycle time and increase throughput. Further, although the second EL layer 13b and the first EL layer 13a are mixed, the second EL layer 13b and the hole-transport layer 23 are separated without being mixed. That is, the high power condition where the energy density is high is such that an energy density at which the film formation material contained in the second EL layer 13b reaches and is mixed into the first EL layer 13a but does not reach and is not mixed into the hole-transport layer 23 is used. Accordingly, the second EL layer 13b and the hole-transport layer 23 are not mixed. Hence, the first EL layer 13a has, a protection function for preventing the film formation material contained in the second EL layer 13b from reaching the hole-transport layer 23 when the second EL layer 13b is formed under the high power condition where the energy density is high. In other words, the first EL layer 13a preferably has a thickness such that the film formation material contained in the second EL layer 13b does not reach the hole-transport layer 23 when the second EL layer 13b is formed under the high power condition where the energy density is high, and may have a thickness of several nanometers, for example. Further, the upper limit of the thickness of the first EL layer 13a is a maximum thickness that enables transfer under the low power condition where the energy density is low. The maximum thickness that enables transfer is determined depending on the low power condition.

Note that a second EL layer formed of two or more layers may be used in the case where an EL layer is formed thick, though the second EL layer 13b formed of one layer is used in this embodiment.

Each component of this embodiment will be described in detail below.

The first substrate 11 is a substrate that transmits irradiation light for forming a film of the material layer over the film-formation target substrate. Accordingly, the first substrate 11 is preferably a substrate having high light transmittance. Specifically, when lamp light or laser light is used in order to form the material layer, a substrate that transmits the light is preferably used as the first substrate 11. As the first substrate 11, a glass substrate, a quartz substrate, a plastic substrate containing an inorganic material, or the like can be used, for example.

The absorption layer 12 is a layer that absorbs irradiation light for heating the material layer 13 and converts it to heat. Therefore, the absorption layer 12 may be formed at least over a region in which the material layer 13 is heated and may have an island shape, for example. The absorption layer 12 is preferably formed of a material with a reflectance of as low as 70% or less and with high absorptance for the irradiation light. It is also preferable that the absorption layer 12 be formed of a material having an excellent heat resistance property so that it does not change with heat. As a material that can be used for the absorption layer 12, for example, a metal nitride such as titanium nitride, tantalum nitride, molybdenum nitride, tungsten nitride, chromium nitride, and manganese nitride; molybdenum; titanium; tungsten; carbon; or the like is preferably used.

The absorption layer 12 can be formed by any of a variety of methods. For example, by a sputtering method, the absorption layer 12 can be formed using a target using molybdenum, tantalum, titanium, tungsten, or the like, or an alloy thereof. In addition, the absorption layer 12 is not limited to a single layer and may include a plurality of layers.

It is preferable that the absorption layer 12 have a thickness such that it does not transmit irradiation light. It is preferable that the thickness be greater than or equal to 100 nm and less than or equal to 2 μm although it depends on a material. In particular, the absorption layer 12 having a thickness greater than or equal to 100 nm and less than or equal to 600 nm can efficiently absorb the irradiation light to generate heat.

Note that the absorption layer 12 may transmit part of the irradiation light as long as the film formation material contained in the material layer 13 is heated to a film formation temperature. However, in the case where the absorption layer transmits part of the light, a material that does not decompose even when irradiated with light is preferably used for the material layer 13. Note that a "film formation temperature" is a temperature at which at least part of a film formation material is transferred from a film formation substrate to a film-formation target substrate, by the action of heat.

The material layer 13 is a layer transferred onto a second substrate by being heated. The layer contains a film formation material to be formed over the film-formation target substrate. In this embodiment, one kind of organic material is used as the film formation material contained in the material layer 13, but two or more kinds of organic materials may be used as the film formation material. The material layer 13 may be a single layer or a stacked layer including plural layers. Note that transfer in this embodiment means that a film formation material contained in the material layer 13 is moved onto a film-formation target substrate.

The material layer 13 is formed by any of a variety of methods. For example, a wet method such as a spin coating method, a spray coating method, an inkjet method, a dip coating method, a casting method, a die coating method, a roll coating method, a blade coating method, a bar coating method, a gravure coating method, a nozzle-printing method, or a printing method can be used. Alternatively, a dry method such as a vacuum evaporation method or a sputtering method can be used.

In order to form the material layer 13 by a wet method, a desired film formation material may be dissolved or dispersed in a solvent, and a solution or a dispersion solution may be adjusted. There is no particular limitation on the solvent as long as it can dissolve or disperse the film formation material and it does not react with the film formation material. For example, halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like can be used. Further, a mixture of plural kinds of those solvents may be used. By using a wet method, it is possible to increase material use efficiency, which leads to a reduction in manufacturing cost.

Note that the material layer does not necessarily need to be a uniform layer as long as the thickness and uniformity of the EL layers 13a and 13b formed over the second substrate 22 are ensured. For example, the material layer may be formed in a fine island shape or may have unevenness.

The second substrate 22 is not limited to a specific one as long as it is a substrate having a needed heat resistance property and having an insulating property on its surface. For example, a glass substrate, a quartz substrate, a stainless steel substrate provided with an insulating film, and the like can be given. Alternatively, a plastic substrate having a heat resistance property enough to withstand heat treatment may be used.

In this embodiment, a flash lamp is used as the light source for the light irradiation performed under the low power condition and the light irradiation performed under the high power condition, but any of a variety of light sources may be used as long as power difference can be ensured.

For example, a discharge lamp such as a xenon lamp or a metal halide lamp, or an exothermic lamp such as a halogen lamp or a tungsten lamp can be used as the light source. Alternatively, such a light source can be used as a flash lamp (e.g., a xenon flash lamp or a krypton flash lamp). Since a flash lamp is capable of emitting very high-intensity light repeatedly to a large area for a short time (0.1 msec to 10 msec), it can heat the substrate uniformly and efficiently regardless of the area of the first substrate. In addition, heating of the first substrate 11 can also be controlled by a change in length of a light emitting period.

Alternatively, a laser device may be used as the light source. As the laser light, it is possible to use laser light emitted from, for example, a gas laser such as an Ar laser, a Kr laser, or an excimer laser; a laser using, as a medium, single crystal YAG; YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof. In addition, in the case of using a solid-state laser, a laser medium of which is solid, the solid-state laser has an advantage in that a maintenance-free condition can be kept for a long time and an advantage in that an output is relatively stable.

Note that as the irradiation light, infrared light (a wavelength of 800 nm or more) is preferably used. With infrared light, the absorption layer 12 can efficiently convert it to heat, and thus the film formation material can be efficiently heated.

Preferably, the first and the second heat treatment may each be performed in an atmosphere where the amount of moisture and oxygen is small or in a reduced-pressure atmosphere. The reduced-pressure atmosphere can be obtained by evacuation of a film-formation chamber with a vacuum exhaust unit to a vacuum of about $5 \times 10^{-3}$ Pa or less, preferably, about $10^{-4}$ Pa to $10^{-6}$ Pa.

Note that although the case where the second substrate 22 that is the film-formation target substrate is located below the first substrate 11 that is the film formation substrate is illustrated in this embodiment, this embodiment is not limited to this. The orientation of the substrates can be determined as appropriate.

Further, although description is made using the material layer 13 containing the film formation material in this embodiment, the material layer 13 may be changed into the following.

A light-emitting substance and an organic compound in which the light-emitting substance is dispersed are used as a first film formation material and a second film formation material, respectively, which are contained in the material layer.

As the light-emitting substance, for example, a fluorescent compound that emits fluorescence or a phosphorescent compound that emits phosphorescence can be used.

As the organic compound in which the light-emitting substance is dispersed, in the case where the light-emitting substance is a fluorescent compound, a substance having higher singlet excitation energy (the energy difference between a ground state and a singlet excited state) than the fluorescent compound is preferably used. In the case where the light-emitting substance is a phosphorescent compound, a substance having higher triplet excitation energy (the energy difference between a ground state and a triplet excited state) than the phosphorescent compound is preferably used.

Note that as the film formation material contained in the material layer, two or more kinds of organic compounds in which the light-emitting substance is to be dispersed may be used, or two or more kinds of light-emitting substances that are to be dispersed in the organic compound may be used. Further, it is acceptable to use two or more kinds of organic compounds in which the light-emitting substance is to be dispersed and two or more kinds of light-emitting substances.

As the high molecular compound contained in the material layer, a high molecular compound having a glass transition temperature satisfying a formula (1) below is used. Preferably, a high molecular compound having a glass transition temperature satisfying a formula (2) below is used. Note that in the formulae (1) and (2) below, the sublimation temperatures of the first film formation material and the second film formation material are measured under the same degree of vacuum (for example, a vacuum of $10^{-3}$ Pa).

$$Ta-100 \le S \le 400 \quad (1)$$

$$Ta-70 \le S \le 400 \quad (2)$$

Note that in the formulae (1) and (2), S represents a glass transition temperature (° C.) of the high molecular compound, and Ta represents a temperature (° C.) which is the higher of the sublimation temperature of the first film formation material or that of the second film formation material.

In the case where the glass transition temperature of the high molecular compound is in the range satisfying the formula (1) above, preferably the formula (2) above, even when a temperature reaches the sublimation temperature of the first film formation material or that of the second film formation material, whichever is lower, the film formation material having the lower sublimation temperature is not easily transferred from the material layer. This is because the movement of the first film formation material and the second film formation material in the material layer is suppressed by the high molecular compound. Further, at or above a temperature which is the higher of the sublimation temperature of the first film formation material or that of the second film formation material, the first film formation material and the second film formation material are easily moved in the material layer and transferred onto the film-formation target substrate. Thus, a time difference between the transfer of the first film formation material and the transfer of the second film formation material is not easily generated, and accordingly, an EL layer having a lower concentration gradient can be formed on the film-formation target substrate.

However, if the glass transition temperature of the high molecular compound is lower than the range of the formula (1) above, it is difficult to suppress the movement of the material having a lower sublimation temperature in the material layer before a temperature reaches the sublimation temperature of the material having a higher sublimation temperature. Therefore, the film formation material having the lower sublimation temperature is transferred first, and then, the film formation material having the higher sublimation temperature is transferred. Alternatively, if the glass transition temperature of the high molecular compound is higher than the range of the formula (1) above, the movement of the first film formation material and the second film formation material in the material layer is suppressed even after a temperature exceeds the higher of the sublimation temperatures of the first film formation material and the second film formation material; therefore, the transfer is not easily performed. The first film formation material and the second film formation material reach high temperatures; thus, they may be decomposed.

Thus, as the high molecular compound, a high molecular compound having a glass transition temperature satisfying the formula (1) above, preferably the formula (2) above is used.

Note that in the case where a material having a glass transition temperature of 200° C., a material having a sublimation temperature of 210° C., and a material having a sublimation temperature of 260° C. are used as the high molecular compound, the first film formation material, and the second film formation material, respectively, a favorable transfer is realized. However, in the case where a material having a glass transition temperature of 200° C., a material having a sublimation temperature of 210° C., and a material having a sublimation temperature of 302° C. are used as the high molecular compound, the first film formation material, and the second film formation material, respectively, a favorable transfer is not realized. This shows that a preferred EL layer is realized under a condition satisfying the formulae (1) and (2).

As the high molecular compound contained in the material layer, cyclo olefin polymer is preferable. Cyclo olefin polymer is easily dissolved in a solvent. Thus, after a film is formed over the film-formation target substrate, cyclo olefin polymer containing the first film formation material and the second film formation material, which is left on the film formation substrate, is redissolved in a solvent, whereby the film formation substrate can be reused. Thus, the cost and the consumption of a material can be reduced. As the high molecular compound, olefin, vinyl, acrylic, polyimide (PI), or the like can be used, or a high molecular EL material can be used. As the high molecular EL material, for example, poly (N-vinylcarbazole) (PVK) and poly(p-phenylenevinylene) (PPV) can be given. Further, a cross-linked polymer such as an epoxy resin, an acrylic resin, or siloxane may be used. Note that in this specification, a high molecular compound means a polymer (polymer) having a repetition structure using one or more kinds of monomers (monomers).

The viscosity of the high molecular compound is easily adjusted. Therefore, the viscosity of a solution of the high molecular compound can be freely adjusted depending on use. For example, in the case where the material layer is formed by a droplet discharge method, with the use of a solution of the high molecular compound that has an increased viscosity, the high molecular compound does not spread over a film-formation target surface, and a fine pattern can be formed.

The viscosity of the high molecular compound can be adjusted by adjusting the molecular weight of the high molecular compound or by changing the ratio of the high molecular compound to the solvent. In general, the viscosity of the solution is increased as a ratio of a high molecular compound is increased.

Embodiment 2

Figure 2A:
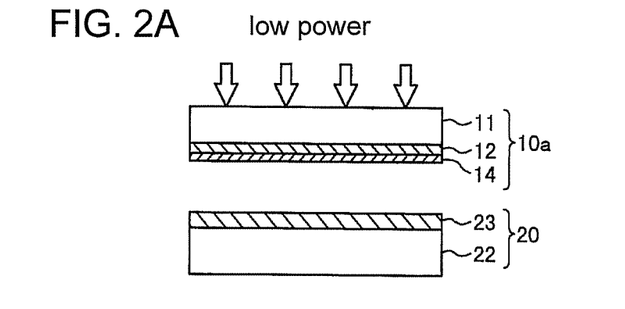
FIGS. 2A to 2C are cross-sectional views for illustrating a film forming method of one embodiment of the present invention.
Figure 2B:
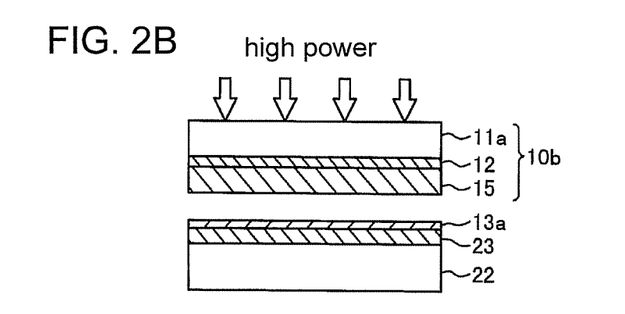
Figure 2C:
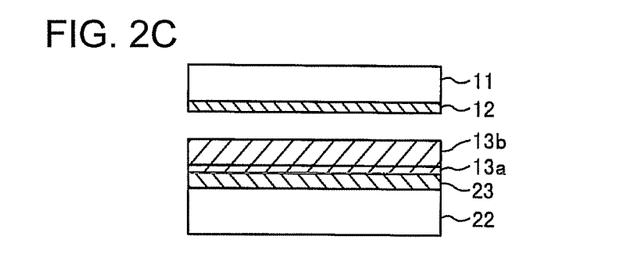

FIGS. 2A to 2C are cross-sectional views illustrating a film forming method of one embodiment of the present invention. The same portions as those in FIGS. 1A to 1C are denoted by the same reference numerals, and only portions that are different from those in FIGS. 1A to 1C are described.

Embodiment 1 illustrated in FIGS. 1A to 1C describes a film forming method using one film formation substrate, but this embodiment will describe a film forming method using two film formation substrates. This will be described in detail below.

In a step shown in FIG. 2A, a film formation substrate (donor substrate) 10a in which an absorption layer 12 is formed on one surface of the first substrate 11 that is a support substrate and an organic EL material layer (hereinafter referred to as "material layer") 14 containing at least a film formation material is formed on the absorption layer 12 is prepared.

Light irradiation is performed with a flash lamp from the rear surface of the first substrate 11 as indicated by arrows. An irradiation condition in that case is the same as that in the step illustrated in FIG. 1A. By the first heat treatment performed in this manner, the heated material layer 14 is transferred onto the hole-transport layer 23. That is, as shown in FIG. 2B, a first EL layer 13a containing the film formation material is formed over the hole-transport layer 23, and the film formation material is not left on the film formation substrate 10a.

By the light irradiation performed under a low power condition where the energy density is low as described above, an effect that is the same as that in Embodiment 1 can be obtained.

In a step shown in FIG. 2B, a film formation substrate (donor substrate) 10b in which the absorption layer 12 is formed on one surface of a third substrate 11a that is a support substrate and an organic EL material layer (hereinafter referred to as "material layer") 15 containing at least a film formation material is formed on the absorption layer 12 is prepared. Further, the second substrate 22 that is the film-formation target substrate 20 is arranged in the position facing the surface of the third substrate 11a on which the absorption layer 12 and the material layer 15 are formed.

Then, light irradiation is performed with a flash lamp from a rear surface of the third substrate 11a as indicated by arrows. An irradiation condition in that case is the same as that in the step illustrated in FIG. 1B. By the second heat treatment performed in this manner, the heated material layer 15 is transferred onto the first EL layer 13a. That is, as shown in FIG. 2C, a second EL layer 13b containing the film formation material is formed over the first EL layer 13a, and the film formation material is not left on the film formation substrate 10b.

By the light irradiation performed under a high power condition where the energy density is high as described above, an effect that is the same as that in Embodiment 1 can be obtained.

In the film forming method using the first and the second heat treatment, the film thicknesses of the first and the second EL layers 13a and 13b formed over the film-formation target substrate 20 by a transfer treatment can be controlled by the film thicknesses of the material layers 14 and 15 formed on the first substrate 11 or the third substrate 11a. In other words, the material layers 14 and 15 formed on the film formation substrates 10a and 10b can be transferred as they are; therefore, a film-thickness monitor is not needed. Accordingly, a practitioner does not have to adjust the film formation speed by use of the film-thickness monitor, and the film formation process can be fully automated. Accordingly, productivity can be increased.

Embodiment 3

Figure 3A:
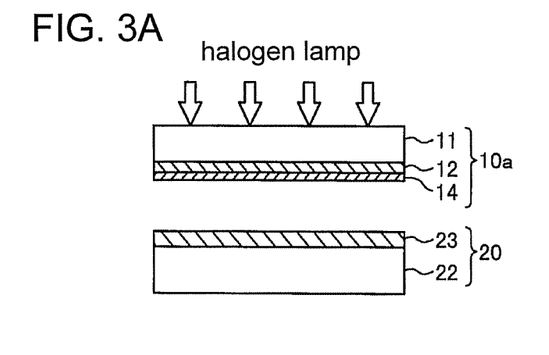
FIGS. 3A to 3C are cross-sectional views for illustrating a film forming method of one embodiment of the present invention.
Figure 3B:
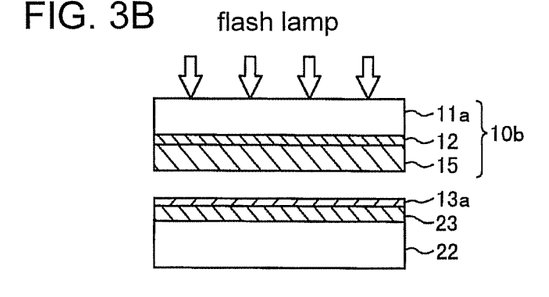
Figure 3C:
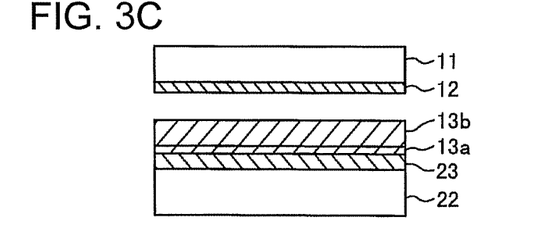

FIGS. 3A to C are cross-sectional views illustrating a film forming method of one embodiment of the present invention. The same portions as those in FIGS. 2A to 2C are denoted by the same reference numerals, and only portions that are different from those in FIGS. 2A to 2C are described.

In Embodiment 2 illustrated in FIGS. 2A to 2C, a flash lamp is used for the light irradiation performed under the low power condition where the energy density is low and under the high power condition where the energy density is high. However, in this embodiment, a halogen lamp is used for the light irradiation under a low power condition where the energy density is low, and a flash lamp is used for the light irradiation performed under a high power condition where the energy density is high.

An effect that is the same as that in Embodiment 2 can also be obtained in this embodiment.

Embodiment 4

In this embodiment, a film forming method of one embodiment of the present invention will be described. Note that in this embodiment, the case where an EL layer of a light-emitting element is formed by a film forming method of one embodiment of the present invention will be described. Note that the film forming method to be described in this embodiment is performed using a material and a manufacturing method that are the same as those in Embodiment 1 if not otherwise stated.

Figure 4A:
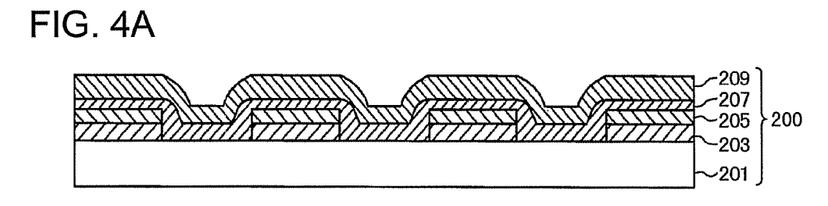
FIGS. 4A to 4C are cross-sectional views for illustrating a film forming method of one embodiment of the present invention.
Figure 4B:
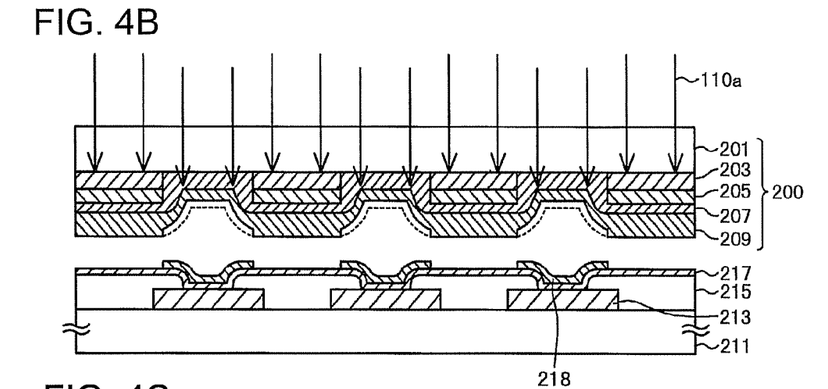
Figure 4C:
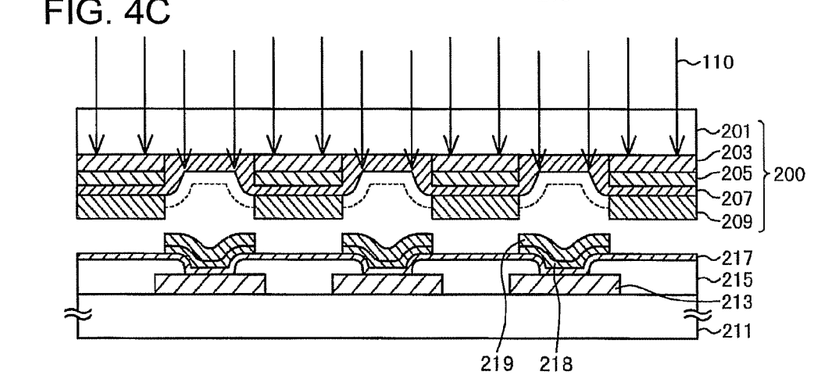

FIGS. 4A to 4C illustrate an example of the case of forming a reflective layer and a heat-insulating layer over a first substrate.

In FIG. 4A, a reflective layer 203 is selectively formed over one surface of a first substrate 201 that is a support substrate. Note that the reflective layer 203 has an opening. Further, a heat-insulating layer 205 is formed over the reflective layer 203. Note that in the heat-insulating layer 205, an opening is formed at a position overlapping with the opening of the reflective layer 203. Further, an absorption layer 207 covering the opening is formed over the first substrate 201 provided with the reflective layer 203 and the heat-insulating layer 205. Furthermore, an organic EL material layer (hereinafter referred to as "material layer") 209 containing a film formation material is formed over the absorption layer 207.

Note that in this specification, "overlap" means not only the case where components included in a film formation substrate (e.g., a reflective layer, an absorption layer, and the like) overlap with each other while in direct contact with each other, but also the case where the components overlap with each other with another layer interposed therebetween.

First, as shown in FIG. 4A, the reflective layer 203 is selectively formed over the one surface of the first substrate 201. The reflective layer 203 is a layer that reflects and blocks irradiation light from the other surface of the first substrate 201 so as not to conduct heat to the material layer 209 that is formed in a region overlapping with the reflective layer 203. Therefore, the reflective layer 203 is preferably formed of a material having high reflectance with respect to the irradiation light. Specifically, the reflective layer 203 is preferably formed of a material with a reflectance of as high as 85% or more, more preferably, a reflectance of as high as 90% or more with respect to the irradiation light.

As a material that can be used for the reflective layer 203, for example, aluminum, silver, gold, platinum, copper, an alloy containing aluminum (for example, an aluminum-titanium alloy, an aluminum-neodymium alloy, and an aluminum-titanium alloy), an alloy containing silver (a silver-neodymium alloy) or the like can be used.

Note that the reflective layer 203 can be formed by any of a variety of methods. For example, the layer can be formed by a sputtering method, an electron beam evaporation method, a vacuum evaporation method, or the like. Further, the thickness of the reflective layer 203 is preferably greater than or equal to 100 nm although it depends on a material. With a thickness of 100 nm or more, transmission of the irradiation light through the reflective layer 203 can be suppressed.

Note that the kind of material suitable for the reflective layer 203 varies depending on the wavelength of light with which the first substrate 201 is irradiated. In addition, the reflective layer is not limited to a single layer and may include a plurality of layers. Further, the absorption layer 207 may be directly formed on the first substrate 201 without providing the reflective layer.

Further, the greater the difference in reflectance between the reflective layer 203 and the absorption layer 207 is, the more preferable it is. Specifically, the difference in reflectance with respect to the wavelength of the irradiation light is preferably 25% or higher, more preferably, 30% or higher.

In addition, although any of a variety of methods can be employed for forming the opening in the reflective layer 203, dry etching is preferably used. By use of dry etching, the opening has a sharper sidewall, and thus a fine pattern can be formed.

Next, the heat-insulating layer 205 is selectively formed over the reflective layer 203. The heat-insulating layer 205 is a layer for suppressing heating and sublimation of the portion of the material layer 209, which is located in the region overlapping with the reflective layer 203. For the heat-insulating layer 205, for example, titanium oxide, silicon oxide, silicon oxynitride, zirconium oxide, titanium carbide, or the like can be preferably used. Note that for the heat-insulating layer 205, a material having lower heat conductivity than materials used for the reflective layer 203 and the absorption layer 207 is used. Note that in this specification, oxynitride is a substance that contains more oxygen than nitrogen in its composition.

The heat-insulating layer 205 can be formed by any of a variety of methods. For example, the layer can be faulted by a sputtering method, an electron beam evaporation method, a vacuum evaporation method, a CVD (chemical vapor deposition) method, or the like. Further, the thickness of the heat-insulating layer may be greater than or equal to 10 nm and less than or equal to 2 µm, preferably greater than or equal to 100 nm and less than or equal to 600 nm, although it depends on a material. By setting the thickness of the heat-insulating layer 205 to be greater than or equal to 10 nm and less than or equal to 2 µm, an effect of blocking heat conduction to the material layer 209, which is located on the reflective layer 203, is obtained even when the reflective layer 203 is heated.

In addition, in the heat-insulating layer 205, an opening is formed in the region overlapping with the opening of the reflective layer 203. Although any of a variety of methods can be employed for forming a pattern of the heat-insulating layer 205, dry etching is preferably used. By use of dry etching, the patterned heat-insulating layer 205 has a sharper sidewall and thus a fine pattern can be formed.

Note that preferably, the heat-insulating layer 205 and the reflective layer 203 are patterned in one-time etching process, and accordingly the sidewalls of the openings provided in the heat-insulating layer 205 and the reflective layer 203 can be aligned with each other, whereby a finer pattern can be formed.

Further, although the heat-insulating layer 205 is formed only in the position overlapping with the reflective layer 203 in this embodiment, the heat-insulating layer 205 may be formed to cover the reflective layer 203 and the opening of the reflective layer 203. In that case, the heat-insulating layer 205 needs to have a transmitting property with respect to visible light.

Next, the absorption layer 207 covering the opening is formed over the first substrate 201 provided with the reflective layer 203 and the heat-insulating layer 205. The absorption layer 207 can be formed of a material that is the same as that of the absorption layer 12 described in Embodiment 1. Note that the absorption layer 207 may be selectively formed. For example, after the absorption layer 207 is formed over an entire surface of the first substrate 201, the absorption layer 207 is patterned into an island-like shape to cover the opening of the reflective layer 203 and the heat-insulating layer 205. In that case, heat conduction in the plane direction of the absorption layer can be prevented and thus the EL layer can be patterned more finely as compared to the case where the absorption layer is formed over the entire surface, and accordingly, a high-performance light-emitting device can be realized.

Next, the material layer 209 is formed over the absorption layer 207. As the material layer 209, a layer that is the same as that in Embodiment 1 can be used.

Next, as shown in FIG. 4B, a second substrate 211 is arranged in the position facing the surface of the first substrate 201 on which the material layer 209 or the like is formed. Note that since the case where an EL layer of a light-emitting element is formed using the film formation substrate of one embodiment of the present invention is described here, a first electrode layer 213 which is to be one of electrodes of the light-emitting element is provided over the second substrate 211. Edge portions of the first electrode layers 213 are covered with an insulator 215. In this embodiment, the electrodes each represent an electrode that serves as an anode or a cathode of the light emitting element. Further, a hole-transport layer 217 is provided over the first electrode layer 213.

A surface of the material layer 209 and a surface of the second substrate 211 are arranged to have a predetermined distance therebetween. Here, the predetermined distance is 0 mm or more and 2 mm or less, preferably, 0 mm or more and 0.05 mm or less, or more preferably, 0 mm or more and 0.03 mm or less.

Note that the predetermined distance is defined as a distance between the surface of the material layer 209 on the first substrate and the surface of the second substrate. However, in the case where a certain kind of film (for example, a conductive film serving as an electrode, a partition wall, or the like) is formed over the second substrate and thus the surface of the film-formation target substrate has unevenness, the predetermined distance is defined as a distance between the surface of the material layer 209 on the first substrate and a topmost surface of a layer formed over the second substrate, that is, a surface of the film (the conductive film, the partition wall, or the like).

Then, as shown in FIG. 4B, light irradiation is performed with a flash lamp from a rear surface of the first substrate 201, i.e. a surface on the side opposite to the surface on which the material layer 209 is formed, as indicated by arrows 110a. An irradiation condition in that case is the same as the step shown in FIG. 1A. By first heat treatment performed in this manner, the portion of the heated material layer 209 is transferred onto the hole-transport layer 217. That is, as shown in FIG. 4B, a first EL layer 218 containing a film formation material is formed over the hole-transport layer 217, and the material layer 209 containing a film for material is left on the film formation substrate 200.

By the light irradiation performed under a low power condition where the energy density is low as described above, an effect that is the same as that in Embodiment 1 can be obtained.

Then, as shown in FIG. 4C, light irradiation is performed with a flash lamp from the rear surface of the first substrate 201 as indicated by arrows 110. An irradiation condition except an energy density in that case is the same as that in the step shown in FIG. 1B. By second heat treatment performed in this manner, the heated material layer 209 is transferred onto the first EL layer 218. That is, a second EL layer 219 containing the film formation material is formed over the first EL layer 218. In such a manner, the EL layers 218 and 219 of the light-emitting element are selectively farmed over the second substrate 211.

By the light irradiation performed under a high power condition where the energy density is high as described above, an effect that is the same as that in Embodiment 1 can be obtained.

Embodiment 5

FIGS. 5A to 5D are cross-sectional views illustrating a film forming method of one embodiment of the present invention.

The same portions as those in FIGS. 4A to 4C are denoted by the same reference numerals, and only portions that are different from those in FIGS. 4A to 4C are described.

Embodiment 4 illustrated in FIGS. 4A to 4C describes a film forming method using one film formation substrate 200, but this embodiment will describe a film forming method using two film formation substrates 200a and 200b. This will be described in detail below.

Figure 5A:
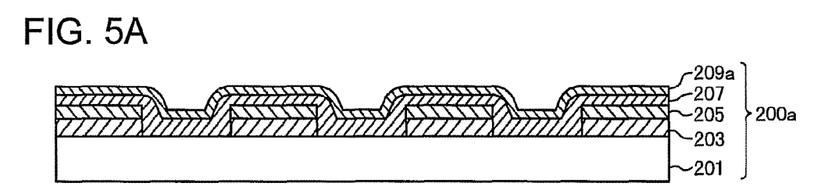
FIGS. 5A to 5D are cross-sectional views for illustrating a film forming method of one embodiment of the present invention.

In a step shown in FIG. 5A, the film formation substrate (donor substrate) 200a in which the reflective layer 203, the heat-insulating layer 205, and the absorption layer 207 are formed over one surface of the first substrate 201 that is a support substrate and an organic EL material layer (hereinafter referred to as "material layer") 209a containing at least a film formation material is formed over the absorption layer 207 is prepared.

Figure 5B:
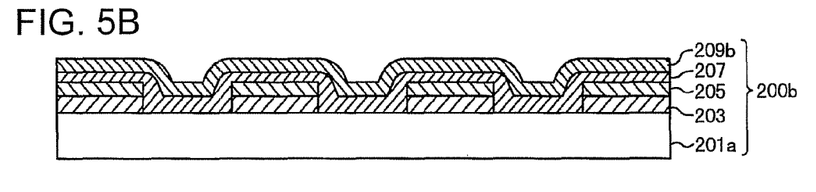

In a step shown in FIG. 5B, the film formation substrate (donor substrate) 200b in which the reflective layer 203, the heat-insulating layer 205, and the absorption layer 207 are formed over one surface of a third substrate 201a that is a support substrate and an organic EL material layer (hereinafter referred to as "material layer") 209b containing at least a film formation material is formed over the absorption layer 207 is prepared.

Figure 5C:
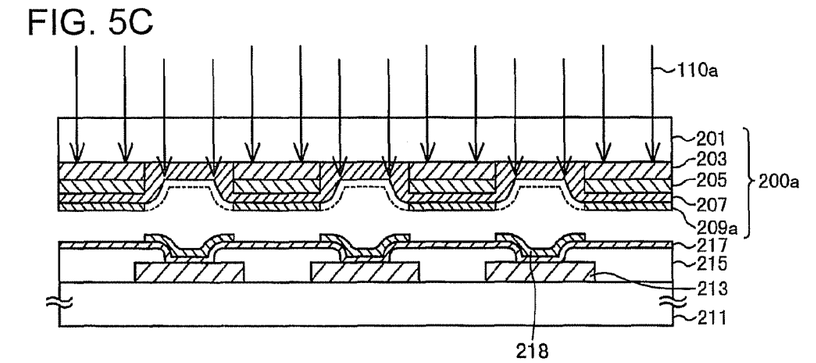

In a step shown in FIG. 5C, light irradiation is performed with a flash lamp from the rear surface of the first substrate 201 as indicated by arrows 110a. An irradiation condition in that case is the same as the step shown in FIG. 4B. By first heat treatment performed in this manner, the heated material layer 209a is transferred onto the hole-transport layer 217. That is, the first EL layer 218 containing the film formation material is formed over the hole-transport layer 217.

By the light irradiation performed under a low power condition where the energy density is low as described above, an effect that is the same as that in Embodiment 4 can be obtained.

Figure 5D:
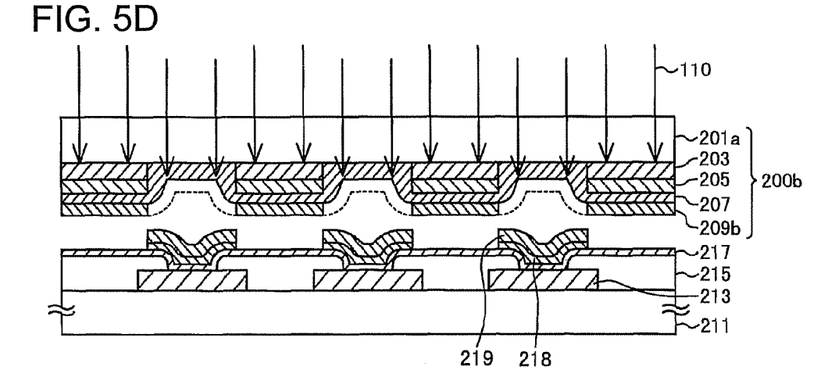

In a step shown in FIG. 5D, the second substrate 211 that is a film-formation target substrate is arranged in the position facing the surface of the third substrate 201a on which the absorption layer 207 and the material layer 209b are formed. Then, light irradiation is performed with a flash lamp from a rear surface of the third substrate 201a, as indicated by arrows 110. An irradiation condition except an energy density in that case is the same as in the step shown in FIG. 4C. By second heat treatment performed in this manner, the heated material layer 209b is transferred onto the first EL layer 218. That is, the second EL layer 219 containing the film formation material is formed over the first EL layer 218.

By the light irradiation performed under a high power condition where the energy density is high as described above, an effect that is the same as that in Embodiment 4 can be obtained.

Note that Embodiments 1~5 can be implemented by being freely combined with each other.

REFERENCE NUMERALS 10, 10a, 10b: film formation substrate (donor substrate)
11: first substrate
11a: third substrate
12: absorption layer
13, 14, 15: material layer
13a: first EL layer
13b: second EL layer
20: film-formation target substrate
22: second substrate
23: hole-transport layer
110, 110a: arrows
200, 200a, 200b: film formation substrate (donor substrate)
201: first substrate
201a: third substrate
203: reflective layer
205: heat-insulating layer
207: absorption layer
209, 209a, 209b: material layer
211: second substrate
213: first electrode
215: insulator
217: hole-transport layer
218: first EL layer
219: second EL layer

The invention claimed is:

1. A film forming method comprising:
arranging a surface of a film formation substrate including an absorption layer on a first substrate and a material layer containing a film formation material on the absorption layer and
a surface of a film-formation target substrate including a first layer over a second substrate, so as to face each other;
forming a second layer containing the film formation material over the first layer by performing first heat treatment on the material layer from the other surface of the film formation substrate; and
forming a third layer containing the film formation material over the second layer by performing second heat treatment on the material layer from the other surface of the film formation substrate,
wherein energy with a density higher than that in the first heat treatment is applied to the material layer in the second heat treatment.

2. The film forming method according to claim 1, wherein the material layer includes at least two kinds of film formation materials and a high molecular compound satisfying a formula (1) below:

$$Ta - 100 \leq S \leq 400 \qquad (1)$$

wherein S represents a glass transition temperature (° C.) of the high molecular compound, and Ta represents a temperature (° C.) which is the higher of sublimation temperatures of the two kinds of film formation materials.

3. The film forming method according to claim 1, wherein the second layer and the first layer are separated by a boundary.

4. The film forming method according to claim 1, wherein the third layer and the second layer are mixed, and wherein the third layer and the first layer are not mixed.

5. The film forming method according to claim 1, wherein a density of energy applied to the material layer in the second heat treatment is energy density at which the film formation material contained in the third layer reaches the second layer but does not reach the first layer.

6. The film forming method according to claim 1, wherein a density of energy applied to the material layer in the first heat treatment is energy density at which the film formation material contained in the second layer does not reach the first layer.

7. The film forming method according to claim 1, wherein the first heat treatment and the second heat treatment are each performed using a method of applying heat by light irradiation from the other surface of the film formation substrate with a light source and by absorption of the light in the absorption layer.

8. The film forming method according to claim 1,
wherein the first layer is a hole-transport layer, and
wherein the second layer and the third layer are layers containing a light-emitting substance.

9. A film forming method comprising:
arranging a surface of a first film formation substrate including a first absorption layer on a first substrate and a first material layer containing a first film formation material on the first absorption layer and
a surface of a film-formation target substrate including a first layer over a second substrate, so as to face each other;
forming a second layer containing the first film formation material over the first layer by performing first heat treatment on the first material layer from the other surface of the first film formation substrate;
arranging a surface of a second film formation substrate including a second absorption layer on a third substrate and a second material layer containing a second film formation material on the second absorption layer and the surface of the film-formation target substrate, so as to face each other; and
forming a third layer containing the second film formation material over the second layer by performing second heat treatment on the second material layer from the other surface of the second film formation substrate,
wherein energy with a density higher than that in the first heat treatment is applied to the second material layer in the second heat treatment.

10. The film forming method according to claim 9,
wherein each of the first material layer and the second material layer includes at least two kinds of film formation materials and a high molecular compound satisfying a formula (1) below:

$$Ta-100 \leq S \leq 400 \quad (1)$$

wherein S represents a glass transition temperature (° C.) of the high molecular compound, and Ta represents a temperature (° C.) which is the higher of sublimation temperatures of the two kinds of film formation materials.

11. The film forming method according to claim 9,
wherein the second layer and the first layer are separated by a boundary.

12. The film forming method according to claim 9,
wherein the third layer and the second layer are mixed, and wherein the third layer and the first layer are not mixed.

13. The film forming method according to claim 9,
wherein a density of energy applied to the second material layer in the second heat treatment is energy density at which the second film formation material contained in the third layer reaches the second layer but does not reach the first layer.

14. The film forming method according to claim 9,
wherein a density of energy applied to the first material layer in the first heat treatment is energy density at which the first film formation material contained in the second layer does not reach the first layer.

15. The film forming method according to claim 9,
wherein the first heat treatment is performed using a method of applying heat by light irradiation from the other surface of the first film formation substrate with a first light source and by absorption of the light in the first absorption layer, and
wherein the second heat treatment is performed using a method of applying heat by light irradiation from the other surface of the second film formation substrate with a second light source and by absorption of the light in the second absorption layer.

16. The film forming method according to claim 9,
wherein the first heat treatment is performed by a method of applying heat by light irradiation from the other surface of the first film formation substrate with a halogen lamp and by absorption of the light in the first absorption layer, and
wherein the second heat treatment is performed using a method of applying heat by light irradiation from the other surface of the second film formation substrate with a flash lamp and by absorption of the light in the second absorption layer.

17. The film forming method according to claim 9,
wherein the first layer is a hole-transport layer, and
wherein the second layer and the third layer are layers containing a light-emitting substance.

* * * * *